(12) United States Patent
Campbell et al.

(10) Patent No.: US 7,878,007 B2
(45) Date of Patent: Feb. 1, 2011

(54) MONITORING METHOD AND SYSTEM FOR DETERMINING AIRFLOW RATE THROUGH AND HEAT REMOVAL RATE OF AN AIR-CONDITIONING UNIT

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 419 days.

(21) Appl. No.: 12/031,982

(22) Filed: Feb. 15, 2008

(65) Prior Publication Data

US 2009/0223234 A1    Sep. 10, 2009

(51) Int. Cl.
F25B 49/00    (2006.01)
G01K 13/00   (2006.01)

(52) U.S. Cl. .................... 62/127; 62/129; 165/11.1; 165/293

(58) Field of Classification Search .................. 62/127, 62/129; 165/11.1, 287, 288, 293
See application file for complete search history.

(56) References Cited

U.S. PATENT DOCUMENTS

| | | | |
|---|---|---|---|
| 6,574,104 B2 | 6/2003 | Patel et al. | |
| 6,684,653 B2 * | 2/2004 | Des Champs et al. | 62/186 |
| 6,775,997 B2 | 8/2004 | Bash et al. | |
| 7,011,143 B2 | 3/2006 | Corrado et al. | |
| 2005/0023363 A1 | 2/2005 | Sharma et al. | |
| 2005/0166609 A1* | 8/2005 | Thybo et al. | 62/126 |
| 2005/0235671 A1 | 10/2005 | Belady et al. | |
| 2006/0232945 A1 | 10/2006 | Chu et al. | |

* cited by examiner

*Primary Examiner*—Marc E Norman
(74) *Attorney, Agent, or Firm*—Geraldine Monteleone, Esq.; Kevin P. Radigan, Esq.; Heslin Rothenberg Farley & Mesiti P.C.

(57) ABSTRACT

Monitoring method and system are provided for dynamically determining airflow rate through and heat removal rate of an air-conditioning unit, such as a computer room air-conditioning unit. The method includes: sensing inlet and outlet temperatures of fluid passing through a heat exchanger associated with the air-conditioning unit; sensing air temperature at an air inlet side of the heat exchanger; automatically determining at least one of airflow rate through or heat removal rate of the air-conditioning unit, the automatically determining employing the sensed inlet temperature and outlet temperature of fluid passing through the heat exchanger, and the sensed air temperature at the air inlet side of the heat exchanger; and outputting the determined airflow rate through or heat removal rate of the air-conditioning unit. In one embodiment, the heat exchanger is an auxiliary air-to-air heat exchanger, and in another embodiment, the heat exchanger is the air-to-liquid heat exchanger of the air-conditioner.

20 Claims, 8 Drawing Sheets

MONITORING METHOD AND SYSTEM FOR DETERMINING AIRFLOW RATE THROUGH AND HEAT REMOVAL RATE OF AN AIR-CONDITIONING UNIT

TECHNICAL FIELD

The present invention relates in general to air-conditioner monitoring and management, and more particularly, to monitoring methods and systems for ascertaining airflow rate through and heat removal rate of an air-conditioning unit to facilitate management of cooling within a facility containing one or more air-conditioning units, such as a data center containing one or more computer room air-conditioning units.

BACKGROUND OF THE INVENTION

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., a data center).

The sensible heat load carried by the air exiting the rack is stressing the ability of the room air-conditioning to effectively handle the load. This is especially true for large installations with "server farms" or large banks of electronics racks close together. In such installations not only will the room air-conditioning be challenged, but the situation may also result in recirculation problems with some fraction of the "hot" air exiting one rack unit being drawn into the air inlet of the same rack or a nearby rack. This recirculating flow is often extremely complex in nature, and can lead to significantly higher rack inlet temperatures than expected. This increase in cooling air temperature may result in components exceeding their allowable operating temperature and in a reduction in long term reliability of the components.

SUMMARY OF THE INVENTION

The shortcomings of the prior art are overcome and additional advantages are provided in one aspect through the provision of a method of monitoring an air-conditioning unit. The method includes: sensing inlet temperature and outlet temperature of a fluid passing through a heat exchanger associated with the air-conditioning unit; sensing air temperature at an air inlet side of the heat exchanger, wherein air flows across the heat exchanger from the air inlet side to an air outlet side thereof; automatically determining at least one of airflow rate through or heat removal rate of the air-conditioning unit, the automatically determining employing the sensed inlet temperature and outlet temperature of fluid passing through the heat exchanger, and the sensed inlet temperature at the air inlet side of the heat exchanger; and outputting the determined airflow rate through or heat removal rate of the air-conditioning unit.

In a further aspect, a monitoring system for an air-conditioning unit is presented. The monitoring system includes: a heat exchanger associated with the air-conditioning unit, wherein air flows across the heat exchanger and fluid passes through the heat exchanger; a fluid temperature sensor disposed at a fluid inlet to the heat exchanger and a fluid temperature sensor disposed at a fluid outlet of the heat exchanger; at least one air temperature sensor disposed at an air inlet side of the heat exchanger, wherein air flows across the heat exchanger from the air inlet side to an air outlet side thereof; and a control unit coupled to the temperature sensors for obtaining sensed temperature values and for employing the sensed temperature values in dynamically determining and outputting at least one of airflow rate through or heat removal rate of the air-conditioning unit.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
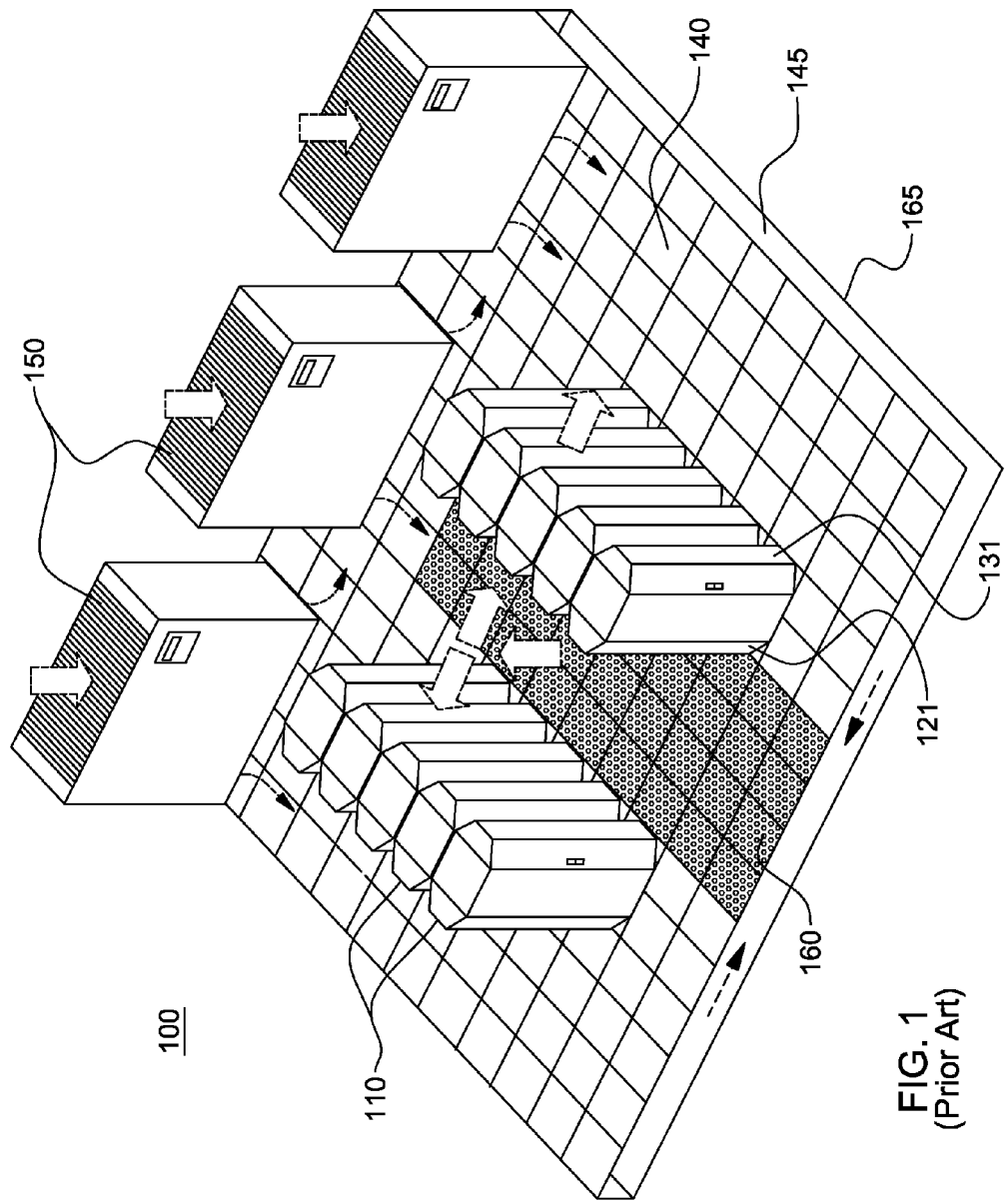
FIG. 1 depicts one embodiment of a conventional data center room layout including a plurality of computer room air-conditioning units.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the electronics drawers of a multi-drawer rack unit and blades of a blade center system being two examples of subsystems of an electronics rack to be cooled.

As used herein, "air-to-liquid heat exchanger" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal communication with a plurality of air-cooled cooling fins. Size, configuration and construction of the air-to-liquid heat exchange assembly and/or air-to-liquid heat exchanger thereof can vary without departing from the scope of the invention disclosed herein. An "air-to-air heat exchanger" may comprise, for example, any heat exchange mechanism characterized as described herein through which cooled air can circulate; and includes one or more discrete air-to-air heat exchangers coupled either in-series or in-parallel. An air-to-air heat exchanger may comprise, for example, one or more coolant flow paths, formed of thermally conductive tubing (such as copper or other tubing) optionally in thermal communication with a plurality of air-cooled cooling fins. Size, configuration and construction of the air-to-air heat exchanger can vary without departing from the scope of the invention disclosed herein. Unless otherwise specified, "heat exchanger" is used herein to refer to either an air-to-liquid heat exchanger or an air-to-air heat exchanger. Further, "data center" refers to a computer installation containing one or more electronics racks to be cooled. As a specific example, a data center may include one or more rows of rack-mounted computing units, such as server units.

As used herein, air flows "across" the heat exchanger and "fluid" flows "through" the heat exchanger. Flowing across the heat exchanger refers to air passing across the outside of the conductive tubing forming the one or more coolant flow paths, while flowing through the heat exchanger refers to the fluid passing through the heat exchanger's one or more coolant flow paths formed by the conductive tubing. Depending upon the embodiment, the "fluid" may be either gaseous (e.g., air) or liquid (e.g., a coolant, such as water). Further, by way of example only, the air-conditioning unit is described hereinbelow as a computer room air-conditioning unit or CRAC unit.

One example of liquid coolant employed in an air-to-liquid heat exchanger is water. However, the concepts disclosed herein are readily adapted to use with other types of liquid coolant. For example, one or more of the liquid coolants may comprise a brine, a fluorocarbon liquid, a liquid metal, or other similar coolant, or refrigerant, while still maintaining the advantages and unique features of the present invention. Further, as explained further below, in various embodiments, an air-to-air heat exchanger may be employed wherein the coolant is cooled air forced or drawn through the heat exchanger. Thus, unless otherwise specified, the word "coolant" is used herein as either a gaseous coolant or a liquid coolant.

Reference is made below to the drawings, which are not drawn to scale for reasons of understanding, wherein the same reference numbers used throughout different figures designate the same or similar components.

FIG. 1 depicts one embodiment of a raised floor, data center room layout 100 typical in the prior art. In this layout, multiple electronics racks 110 are disposed in one or more rows. A computer installation such as depicted in FIG. 1 may house several hundred, or even several thousand, microprocessors. In the arrangement of FIG. 1, chilled air enters the computer room via floor vents 160 from a supply air plenum 145 defined between the raised floor 140 and a base or subfloor 165 of the room. Cooled air is taken in through louvered front covers 121 at air inlet sides of the electronics racks 110 and expelled through the louvered back covers 131 (at the air outlet sides) of the electronics racks. Each electronics rack 110 may have an air moving device (e.g., fan or blower) to provide forced inlet-to-outlet airflow to cool the electronics within the subsystem(s) of the rack. The supply air plenum 145 provides conditioned and cooled air to the air inlet sides of the electronics racks via perforated floor tiles 160 disposed in a "cold" aisle of the computer installation. The conditioned and cooled air is supplied to plenum 145 by one or more air-conditioning units 150, also disposed within the computer installation 100. Room air is taken into each air-conditioning unit 150 near an upper portion thereof. This room air comprises in part exhausted air from the "hot" aisles of the computer installation defined, for example, by opposing air outlet sides of the electronics racks 110.

Figure 2:
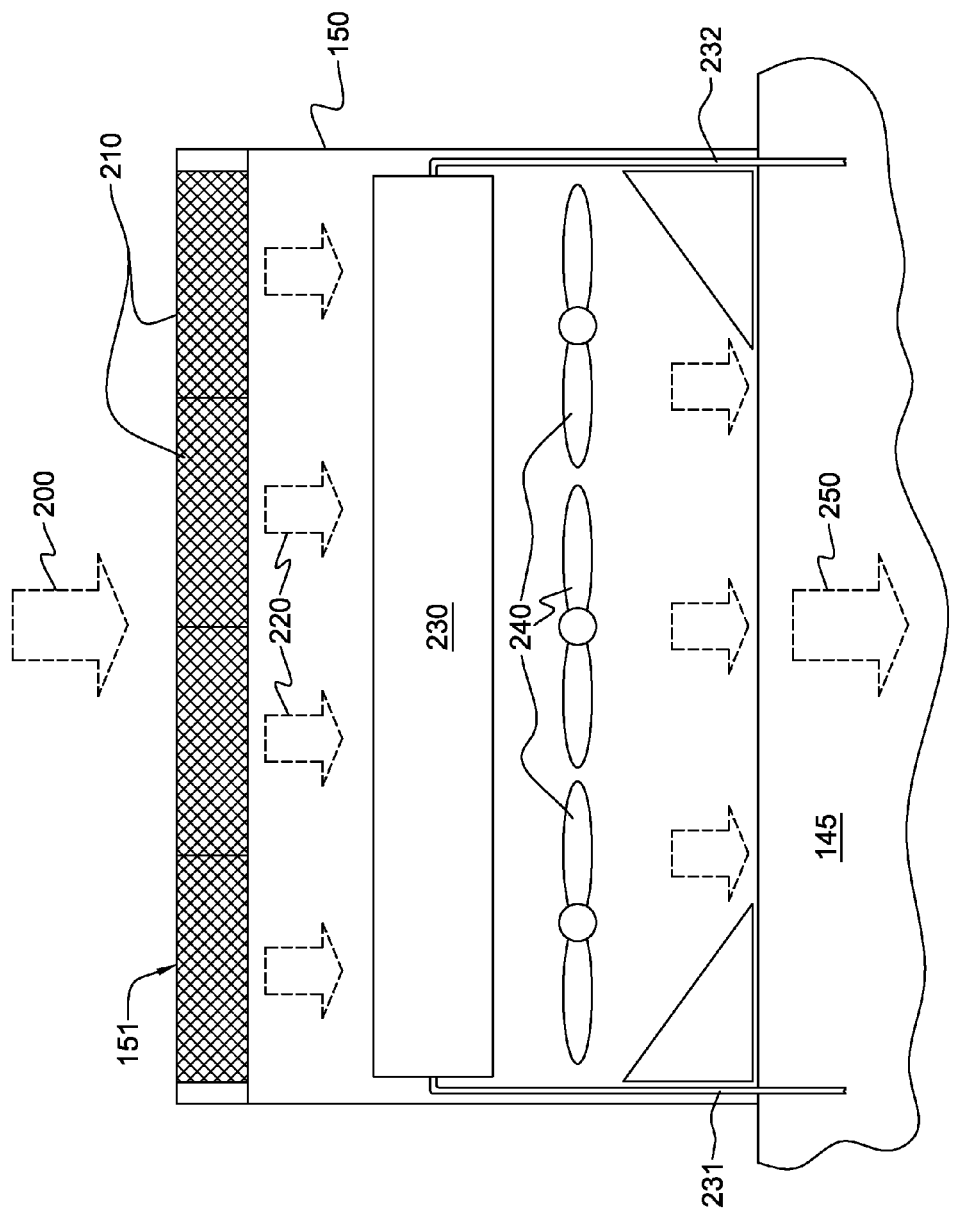
FIG. 2 is a cross-sectional elevational view of one embodiment of one computer room air-conditioning unit of the plurality of computer room air-conditioning units depicted in FIG. 1.

FIG. 2 illustrates one embodiment of a computer room air-conditioning (CRAC) unit 150 with a top to bottom airflow design, and which is used to provide temperature-conditioned air for electronics rack cooling in a raised floor data center configuration. As illustrated, warm computer room air 200 enters CRAC unit 150 via an open vent 151 at an air inlet of the CRAC unit, and flows through a set of air filters 210. After passing through air filters 210, the filtered warm air is cooled as it passes across an air-to-liquid heat exchanger 230. Coolant is provided via a coolant supply line 231 and coolant return line 232 to air-to-liquid heat exchanger 230. The filtered, warm air 220 is drawn across air-to-liquid heat exchanger 230 via one or more air-moving devices 240 (e.g., fans or blowers) disposed in the lower portion of CRAC unit 150. The cooled air 250 is pushed by air-moving devices 240 into space 145 under the raised floor to create the pressurized plenum needed to facilitate raised floor data center cooling via the perforated tiles discussed above with reference to FIG. 1. The air-to-liquid heat exchanger is typically supplied with sub-ambient chilled coolant from a refrigeration chiller plant. This chilled coolant absorbs heat from the warm air passing across the air-to-liquid heat exchanger, and rejects the heat to the refrigeration chiller plant (not shown).

Limiting factors for cooling an air-cooled data center such as depicted in FIG. 1 are related to the maximum chilled airflow rate that can be supplied from a single perforated tile, the maximum cooling capabilities of each air-conditioning unit, and the hot air recirculation phenomenon that is common in these systems. Hot air recirculation occurs when the total airflow rate of supplied chilled air in front of an electronics rack is less than the total rack airflow rate, leading to the hot exhaust air from one electronics rack being drawn into the intake of the same or another electronics rack, thus potentially resulting in unacceptably high rack inlet temperatures. As noted, this can impact reliability and performance of the electronics in the rack, and also lead to device failure in extreme cases. To counter these recirculation issues, or to take into account future expansion plans, some data centers may adopt a brute force approach, by providing two or three times the actual cooling capacity otherwise required to cool the electronics racks within the data center.

Data center thermal problems may be addressed using one of at least two approaches. Specifically, by a human operator, with some degree of trial and error, making changes in the layout of perforated tiles, server racks, air-conditioning units, and room geometry (e.g., ceiling, walls, partitions, ducts, type of tiles), or by changing the operating point of the air-conditioning units (e.g., air or liquid flow rate, set point temperatures, etc.). Alternatively, computer-based techniques may be employed to model the data center, simulate several "what if?" scenarios, and then derive a plan for making actual changes to improve cooling within the computing clusters. For both approaches, it would be significant to know the CRAC heat removal rate (i.e., the thermal load), as well as the CRAC volumetric airflow rate. The CRAC heat load is significant in identifying which CRAC units are being under-utilized, and which are being over-utilized in a data center containing multiple CRAC units. There can be several reasons for low heat load removal, including low airflow rate due to damaged air-moving devices, or clogged air filters, or the occurrence of CRAC recirculation where relatively cool air is drawn into the CRAC unit, resulting in wasted energy input. Such CRAC data is currently unavailable to the data center thermal engineer. In one approach, labor-intensive electrical clamping tools (watt meter, amp meter) may be used to provide relatively sparse information. In practice, however, the CRAC loading and CRAC airflow rates are unknown quantities, and may only be guessed at based on nameplate data, which can lead to significant errors in the thermal design of a data center. Thus, disclosed hereinbelow are various methods and systems to automatically determine and output CRAC thermal loading and CRAC airflow rates.

Two embodiments are described hereinbelow, one employing an auxiliary air-to-air heat exchanger, and the other, the air-to-liquid heat exchanger of the CRAC unit itself. In both embodiments, air temperature is sensed at the air inlet side of the heat exchanger, wherein air flows across the heat exchanger from an air inlet side to an air outlet side thereof, and inlet temperature and outlet temperature of fluid passing through the heat exchanger is sensed. These temperature values are employed in dynamically determining at least one of airflow rate through or heat removal rate of the air-conditioning unit. The monitoring method and system described hereinbelow then outputs the determined airflow rate and/or heat removal rate to an operator of the data center. In the embodiments described herein, a single CRAC unit is discussed, however, those skilled in the art will understand that the concepts described herein are readily adapted to a plurality of CRAC units disposed within a data center configuration. For example, each CRAC unit within the data center may separately provide the temperature values required to ascertain the airflow rate through and heat removal rate of that CRAC unit to a centralized monitoring unit for the data center, which automatically determines the respective airflow rate and/or heat removal rate. Also, although described herein with reference to a data center and a computer room air-conditioning unit, the concepts disclosed below are equally applicable to any air-conditioning unit for which airflow rate through or heat removal rate of the air-conditioning unit is desired.

Figure 3:
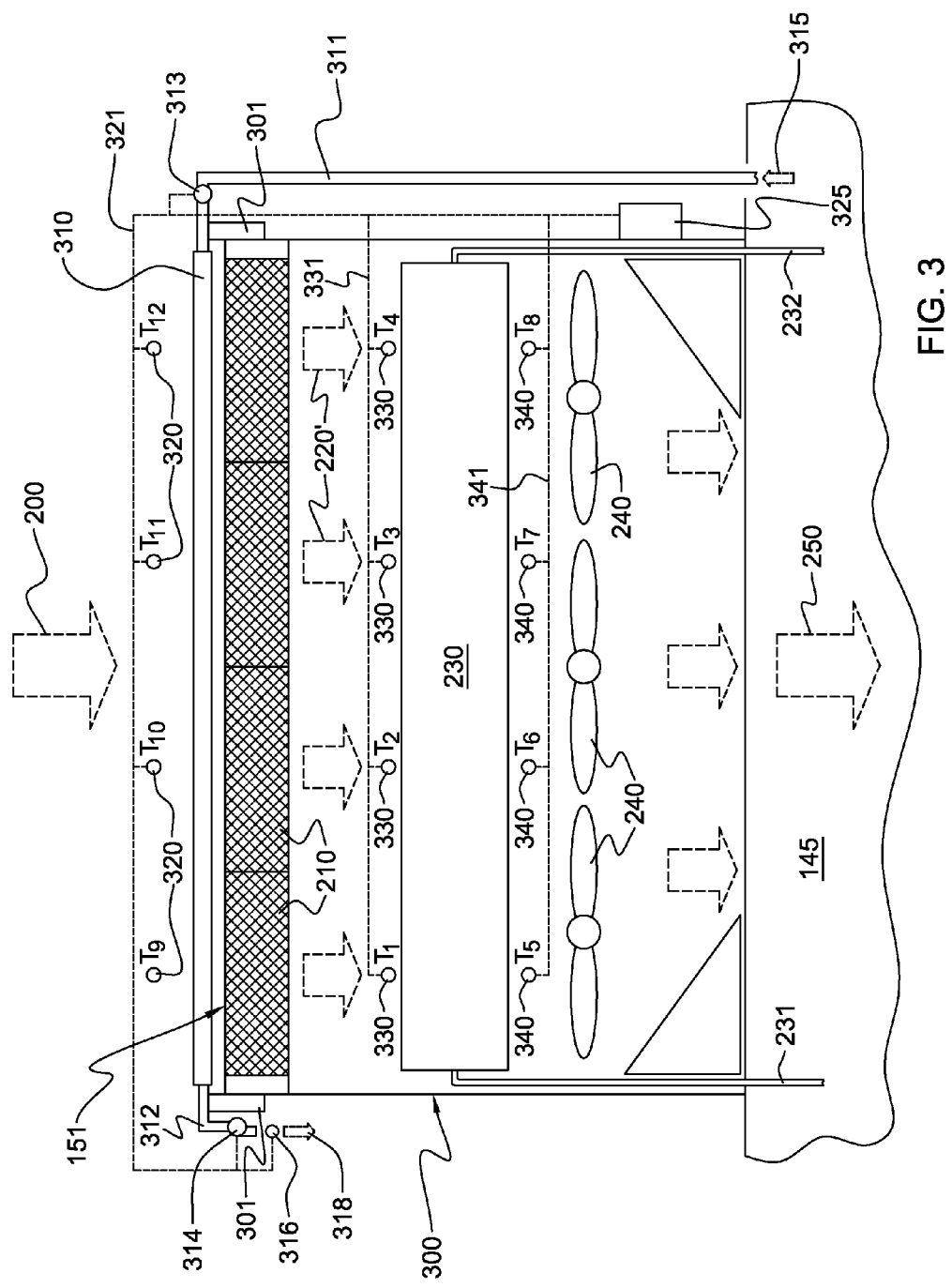
FIG. 3 is a cross-sectional elevational view of one embodiment of a computer room air-conditioning unit, modified with a monitoring system, in accordance with an aspect of the present invention.

FIG. 3 illustrates one embodiment of a CRAC unit with a monitoring system, in accordance with an aspect of the invention disclosed herein. CRAC unit 300 is configured as a top to bottom airflow unit, wherein warm data center air 200 is drawn through an open vent 151 at an air inlet of the CRAC unit, and flows through filters 210. The conditioned, warm air 220' is then drawn across air-to-liquid heat exchanger 230 via one or more air-moving devices 240. Heat is removed from the conditioned, warm air as it passes across the air-to-liquid heat exchanger via coolant passing through the air-to-liquid heat exchanger provided via coolant supply line 231 and coolant return line 232. The resultant conditioned, cooled air 250 is pushed into space 145 below the raised floor data center.

In the illustrated embodiment, the monitoring system associated with the computer room air-conditioning unit includes an air-to-air heat exchanger 310 positioned at the air inlet side of CRAC unit 300. This air-to-air heat exchanger 310 is referred to herein as the sense loop heat exchanger, and is attached to CRAC unit 300 via one or more sleeves 301. Sleeves 301 conform to the perimeter of the CRAC unit and can be fabricated of a flexible material, such as rubber, EPDM, or a polymer. More particularly, the one or more sleeves 301 may be designed (in one embodiment) to stretch 1-2 inches on each side to facilitating attaching air-to-air heat exchanger 310 to the upper portion of the CRAC unit, and to facilitate creating of an air-tight seal along the perimeter of the CRAC unit, thereby ensuring that air flowing into the CRAC unit first flows across the air-to-air heat exchanger.

The monitoring system further includes multiple temperature sensors 320, 330, 340, 313 & 316. These temperature sensors include temperature sensors $T_1$, $T_2$, $T_3$ & $T_4$ at the air inlet side of air-to-liquid heat exchanger 230, temperature sensors $T_5$, $T_6$, $T_7$ & $T_8$ at the air outlet side of air-to-liquid heat exchanger 230, temperature sensors $T_9$, $T_{10}$, $T_{11}$, & $T_{12}$ at the air inlet to CRAC unit 300, temperature sensor 313 at the fluid inlet to air-to-air heat exchanger 310 to sense temperature of fluid supplied by fluid inlet line 311, and temperature sensor 316 at the fluid outlet of air-to-air heat exchanger 310 to monitor temperature of fluid exhausted via fluid outlet line 312.

As illustrated, fluid is drawn through air-to-air heat exchanger 310 via, for example, one or more fluid pumps 314 disposed in fluid communication with fluid outline line 312. In the embodiment of FIG. 3, the fluid passing through air-to-air heat exchanger 310 is air 315 drawn from the cold air plenum defined within space 145 of the raised floor data center. Specifically, the inlet port of the sense loop heat exchanger is vented to the under-floor plenum to allow cool air to be supplied to the inlet of the sense loop heat exchanger. The tube employed for this purpose can be rigid or flexible and made of thermally non-conductive material, and a floor tile with an appropriately sized cutout can be used to facilitate extending of the tube into the under-floor space 145. Air 318 is exhausted from the sense loop heat exchanger into the data center room. In one embodiment, fluid pump 314 is a small fan which is used to force or draw a modest airflow rate through the sense loop defined by the one or more channels within the air-to-air heat exchanger. The sense loop is calibrated in the laboratory so that a certain RPM of the fan will result in a known airflow rate through the sense loop.

Data obtained via the sense loop includes the various temperature values measured by temperature sensors 313, 316 & 320, as well as the air-moving device's RPM information obtained from fluid pump 314. This data is fed back via a data line 321 to a control unit 325, which in the embodiment illustrated, is attached to CRAC unit 300. The temperature values obtained via temperature sensors 330 & 340 are also fed, via data lines 331 & 341, respectively, to control unit 325. The control unit employs the sensed temperature values and RPM information in automatically determining and outputting at least one of airflow rate through or heat removal rate of the air-conditioning unit (as explained further below). In one embodiment, the determined airflow rate through or heat removal rate of the air-conditioning unit is displayed at control unit 325 via, for example, a display screen mounted on an exposed outer surface of the control unit.

Figure 4B:
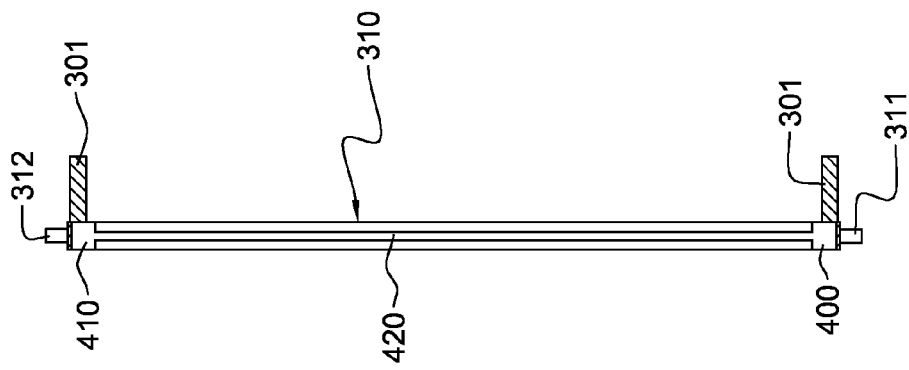
FIG. 4B is a side elevational view of the heat exchanger embodiment of FIG. 4A, in accordance with an aspect of the present invention.
Figure 4A:
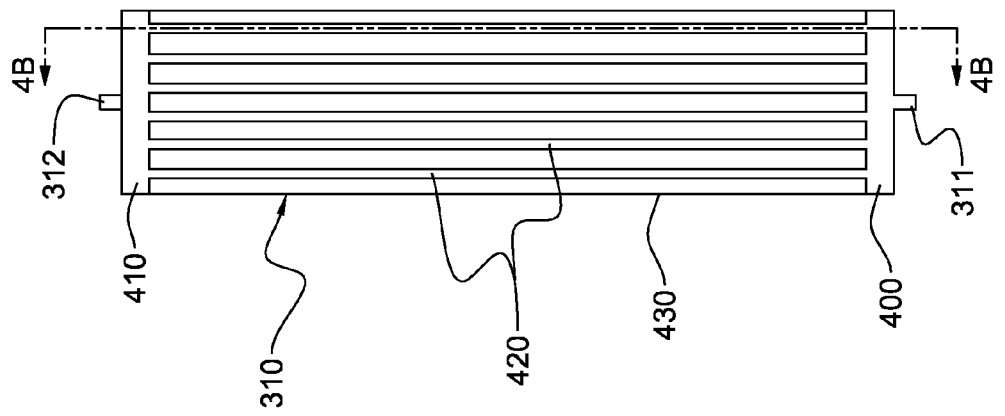
FIG. 4A is an elevational view of one detailed embodiment of a heat exchanger employable by the monitoring methods and systems described herein, in accordance with an aspect of the present invention.

FIGS. 4A & 4B depict one embodiment of an air-to-air heat exchanger 310 (or sense loop heat exchanger) employable in monitoring CRAC airflow rate and/or heat removal rate, as described herein. Referring to both figures collectively, air-to-air heat exchanger 310 is shown to include an inlet plenum 400 in fluid communication with fluid inlet line 311 and an outlet plenum 410 in fluid communication with fluid outlet line 312. Disposed between inlet plenum 400 and outlet plenum 410 are a plurality of thermally conductive tubes 420, for example, six metal tubes, such as copper tubes, in the illustrated embodiment. A heat exchange support frame 430 may also be provided to provide rigidity to the heat exchanger and facilitate mounting of the heat exchanger to the CRAC unit at the air inlet of the CRAC unit. Mounting of the air-to-air heat exchanger to the CRAC unit is facilitated via the provision of sleeves 301, which enable permanent or temporary attachment of the air-to-air heat exchanger to the CRAC unit, and which form an air-tight seal to the CRAC unit to ensure that air passing into the CRAC unit first passes across the air-to-air heat exchanger.

One significant thermal performance metric for a heat exchanger is its effectiveness, which is defined as the ratio of actual heat the heat exchanger is transferring from one fluid stream to another, to the theoretical maximum heat exchange possible for certain given inlet air and fluid temperature values. Effectiveness is a measure of how well a given heat exchanger is designed and how well the heat exchanger performs under certain input conditions (e.g., flow rates). Effectiveness is a characteristic of the heat exchanger and is determined by its physical design, the thermo-physical properties of the materials that are used in the heat exchanger's construction, the thermo-physical properties of the fluids that flow across and through the heat exchanger, and the heat capacity rates of the fluids (i.e., mass flow rate multiplied by specific heat) of the fluids that flow through the heat exchanger. In practical terms, effectiveness can be calculated using the ratio of two temperature differences, wherein the numerator is the temperature rise in the fluid stream which has the smaller of the two heat capacity rates (i.e., the sense loop), with heat capacity rate being calculated as the product of the volumetric flow rate, the specific heat and the density. The denominator is the temperature difference between the inlet of the CRAC unit, and the inlet of the sense loop. This denominator represents the maximum available temperature differential that is driving the heat exchange.

Figure 5:
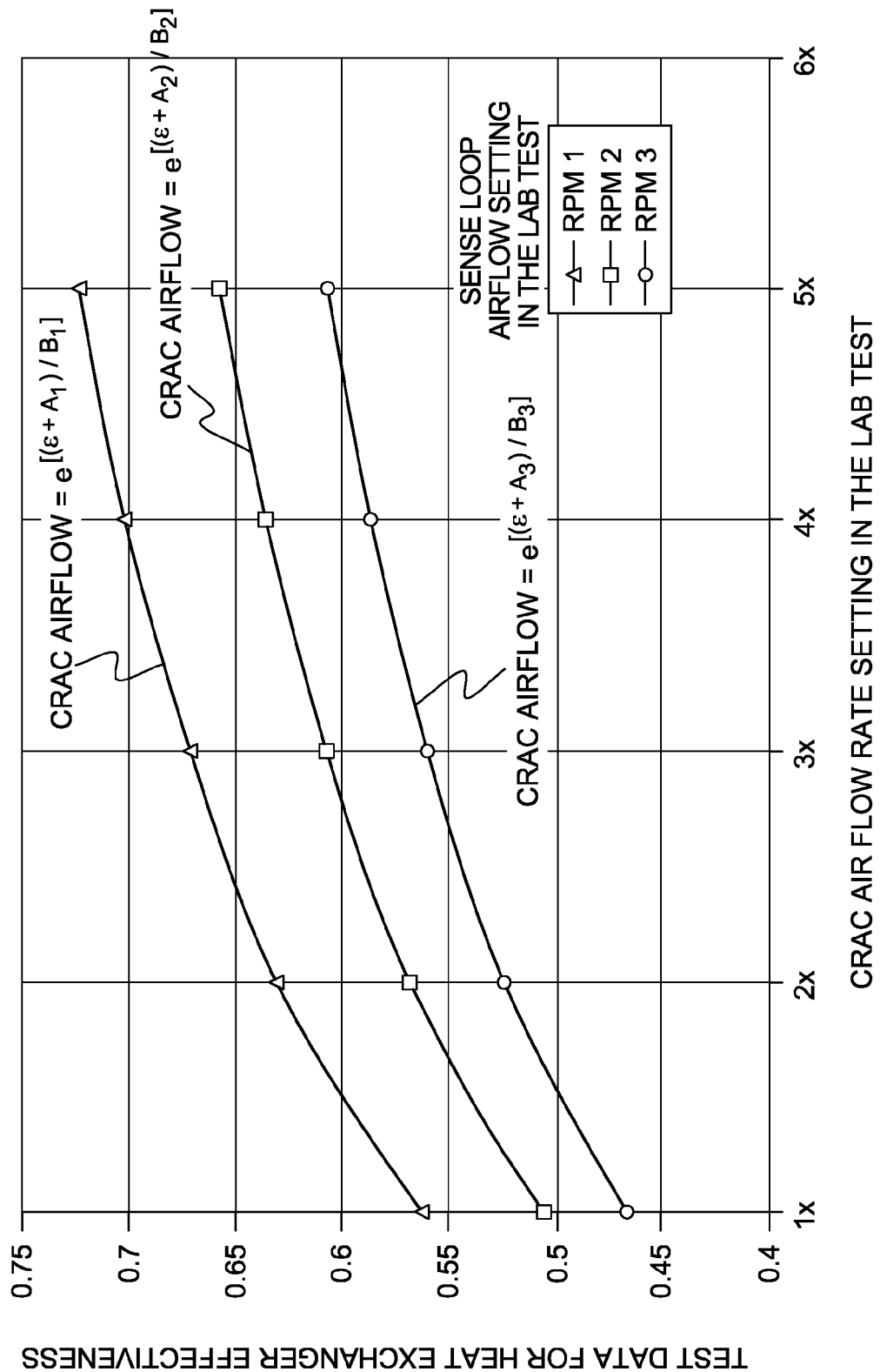
FIG. 5 is a plot of heat exchanger effectiveness versus airflow rate through a computer room air-conditioning unit for various calibrated fluid flow rates through the air-to-air heat exchanger, in accordance with an aspect of the present invention.

FIG. 5 illustrates data obtained by a lab-based calibration testing of a sense loop heat exchanger, such as air-to-air heat exchanger 310 in the embodiment of FIGS. 3 & 4. These typical curves illustrate variation of heat exchanger effectiveness with total airflow rate across the heat exchanger (i.e., in operation, the CRAC unit airflow rate), and sense loop airflow rate through the heat exchanger. Curves are shown characterizing the relationship between the effectiveness and the CRAC airflow rate for different sense loop airflow rates. For a given sense loop airflow rate, which can be established by setting the RPMs of the fluid pump in the sense loop, an expression can be derived to relate CRAC airflow rate to heat exchanger effectiveness using experimental data. One possible mathematical form that can be fitted to the data is that of the exponential functions shown by way of example in FIG. 5. The exponential constants A & B depend upon the sense loop airflow rate, which in turn is governed by the RPMs of the fluid pump. Depending on the various design and operating parameters, other mathematical forms (e.g., logarithmic, polynomial, linear, etc.) might also fit the data. The expression corresponding to a given RPM rate can then be used to estimate the CRAC airflow rate after the effectiveness has been determined. Once the CRAC airflow rate is determined, the CRAC thermal loading can be calculated using the air temperature difference across the two sides of the CRAC unit's air-to-liquid heat exchanger ($\Delta T_{HX}$). The CRAC thermal loading (in watts) is equal to the product of the CRAC airflow rate (in cubic meters per second), the air density (kilograms per cubic meter), the air specific heat (Joules per kilogram per degree Celsius), and the temperature difference across the two sides of the CRAC unit's air-to-liquid heat exchanger ($\Delta T_{HX}$). Both the air density and the specific heat of air are quantities that are readily available to one skilled in the art via heat transfer handbooks or other such technical information sources. A representative heat exchanger design was employed to determine this typical heat exchanger behavior as illustrated in FIG. 5.

Plots of effectiveness versus CRAC airflow rate can be readily generated in a lab prior to shipment of a particular CRAC unit with a monitoring system as described herein. Thus, in the field, using the various temperature sensors, and knowledge of the sense loop airflow rate to fan RPM relationship, heat exchanger effectiveness can be determined. Using a known relationship between the effectiveness and the CRAC airflow rate, the real-time CRAC airflow rate can be determined.

Figure 6:
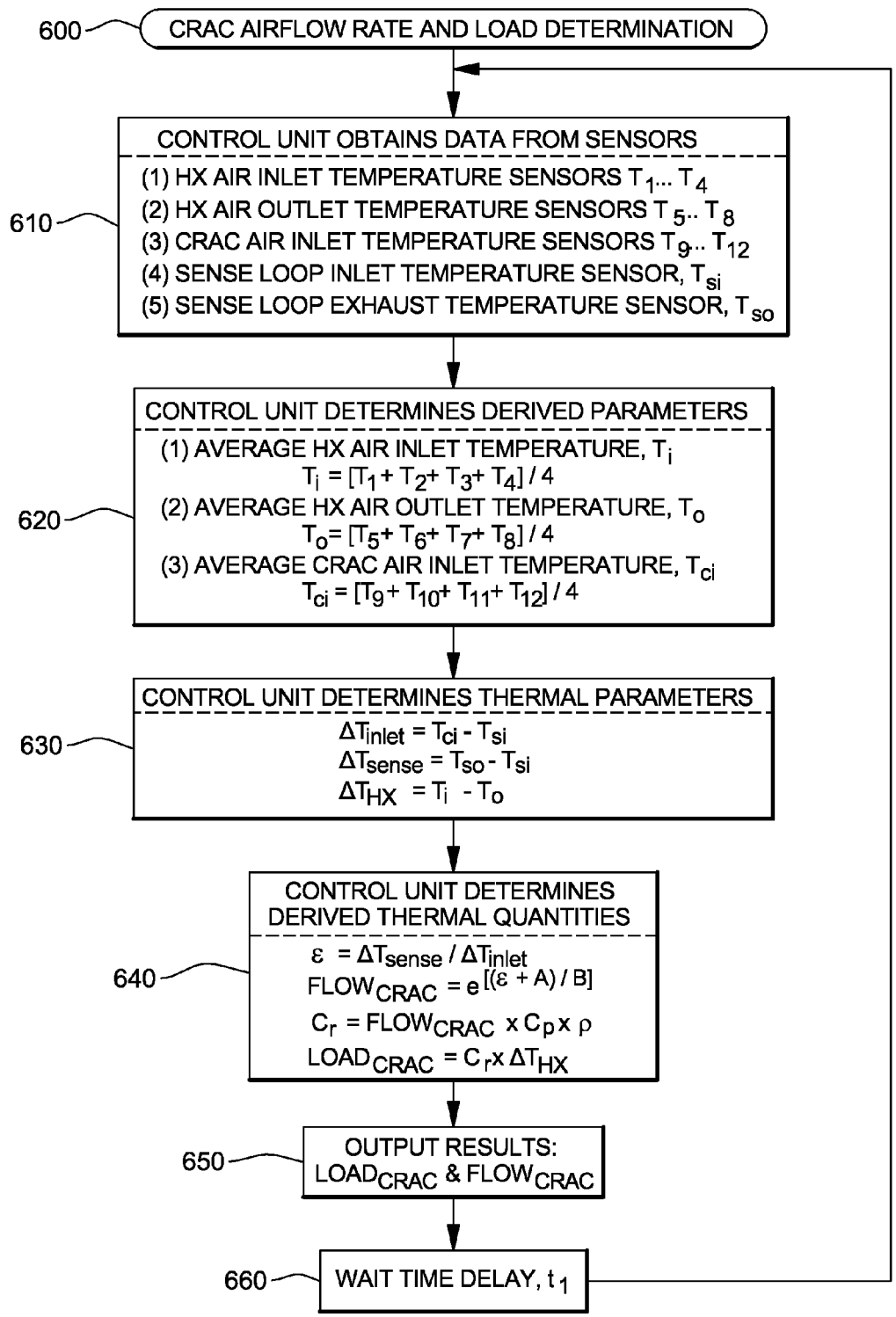
FIG. 6 is a flowchart of one embodiment of processing for determining airflow rate through and heat removal rate of a computer room air-conditioning unit, using the monitoring system of FIG. 3, in accordance with an aspect of the present invention.

FIG. 6 illustrates a flowchart of one embodiment for determining CRAC airflow rate and heat removal rate of a computer room air-conditioning unit employing the monitoring system of FIG. 3. CRAC airflow rate and load determination 600 begins with the control unit (or centralized monitoring unit) obtaining data from the various temperature sensors 610. Specifically, heat exchanger air inlet temperature sensors $T_1 \ldots T_4$ provide air temperature values for air at the air inlet side of the air-to-liquid heat exchanger of the CRAC unit, outlet temperature sensors $T_5 \ldots T_8$ provide air temperature values for air egressing from the air-to-liquid heat exchanger, temperature sensors $T_9 \ldots T_{12}$ provide air temperature values for air ingressing into the CRAC unit at the air inlet thereof, inlet temperature sensor $T_{si}$ provides temperature of fluid (or in this example, air) entering the fluid inlet of the sense loop of the air-to-air heat exchanger, and temperature sensor $T_{so}$ provides temperature of air exiting the fluid outlet of the sense loop.

Next, the control unit calculates various derived parameters 620. In this example, the average heat exchanger air inlet temperature $T_i$ and the average heat exchanger air outlet temperature $T_o$ are calculated by simple averaging of the respective sensed temperature values at the air inlet side and air outlet side of the air-to-liquid heat exchanger. More representative temperature values are achieved by this averaging of the inlet air temperatures and averaging of the outlet air temperatures. In an alternate embodiment, more or less temperature sensors may be employed to obtain the air inlet and air outlet temperature values of the air-to-liquid heat exchanger. Additionally, the CRAC air inlet temperature $T_{ci}$ is averaged to obtain an average temperature at the air inlet of the CRAC unit. This calculation can again be a simple averaging of the temperature values obtained at the air inlet of the CRAC unit.

The control unit next determines various thermal parameters 630, including $\Delta T_{inlet}$, $\Delta T_{sense}$, and $\Delta T_{HX}$. These thermal parameters, which are defined in Table 1 below, are then employed in determining effectiveness of the sense loop heat exchanger, and subsequently, the airflow rate through and heat removal rate of CRAC unit 640. The equations employed in determining effectiveness, airflow rate through the CRAC unit, heat capacity rate of the air passing over the sense loop heat exchanger and heat removal rate of the CRAC unit are described below. After determining CRAC airflow rate and heat removal rate, the results may be output by the control unit, or forwarded to a monitoring unit (not shown) for centralized output 650. The control unit then waits a defined time interval $t_1$ before returning to obtain a new set of temperature sensor readings 660, and automatically repeating the transparent determination of CRAC airflow rate and heat removal rate.

The variables and equations employed in the flowchart of FIG. 6 are defined as follows:

TABLE 1

| Variable/Equation | Definition |
| --- | --- |
| $T_1, T_2, T_3, T_4$, | Air temperature sensors located at the air inlet side of the CRAC heat exchanger, ° C. |
| $T_5, T_6, T_7, T_8$ | Air temperature sensors located at the air outlet side of the CRAC heat exchanger, ° C. |
| $T_9, T_{10}, T_{11}, T_{12}$ | Air temperature sensors located at the air inlet of the CRAC, ° C. |
| $T_{si}$ | Air temperature sensor located at the fluid inlet of the sense loop, ° C. |
| $T_{so}$ | Air temperature sensor located at the fluid outlet of the sense loop, ° C. |
| $T_i$ | Average air temperature calculated via averaging of data from the sensors at the air inlet side of the CRAC heat exchanger, ° C. |
| $T_o$ | Average air temperature calculated via averaging of data from the sensors at the air outlet side of the CRAC heat exchanger, ° C. |
| $T_{ci}$ | Average CRAC air inlet temperature, ° C. |
| $\Delta T_{inlet}$ | Temperature difference between the average of the CRAC air inlet ($T_{ci}$) & the fluid inlet of the sense loop ($T_{si}$), ° C. |
| $\Delta T_{sense}$ | Temperature difference measured between the inlet and outlet of the sense loop ($T_{so} - T_{si}$), ° C. |
| $\Delta T_{HX}$ | Temperature difference between the air inlet side ($T_i$) & the air outlet side ($T_o$) of the CRAC heat exchanger, ° C. |
| $\epsilon$ | Effectiveness of the heat exchanger. |
| $Flow_{CRAC}$ | CRAC airflow rate, m³/s. |
| $C_r$ | Heat capacity rate of the CRAC airflow which characterizes the air's ability to carry heat away. It is the product of the volumetric flow rate, the mass density, and the mass specific heat, W/° C. |
| $Load_{CRAC}$ | Heat removal rate of the CRAC unit (i.e., the cooling function that the CRAC is performing), W. |
| $\rho$ | Air mass density of air in kg/m³. |
| $C_p$ | Air specific heat (J/kg-K). |
| A, B | Constants that are derived from laboratory data using regression analysis. A & B depend on sense loop airflow rate and thus the sense loop RPM. |
| $T_i = [T_1 + T_2 + T_3 + T_4]/4$ | Spatial averaging of temperature values at air inlet side of CRAC heat exchanger. |
| $T_o = [T_5 + T_6 + T_7 + T_8]/4$ | Spatial averaging of temperature values at air outlet side of CRAC heat exchanger. |
| $T_{ci} = [T_9 + T_{10} + T_{11} + T_{12}]/4$ | Spatial averaging of temperature values at CRAC inlet (before air crosses the sense loop heat exchanger). |
| $\Delta T_{inlet} = T_i - T_{si}$ | This is the temperature difference that drives the exchange of the heat between the two fluid streams (both of them air in this case) of the sense loop heat exchanger. This is commonly known as the "heat exchanger inlet temperature difference". This is the difference in the temperature of two fluid streams entering the heat exchanger. In this case, these temperatures are at the air inlet to the CRAC heat exchanger and the inlet sense loop air temperature. |
| $\Delta T_{sense} = T_{so} - T_{si}$ | This is the temperature difference between the sense loop air at the outlet and inlet thereof, ° C. |
| $\Delta T_{HX} = T_i - T_o$ | This is the temperature difference between the air at the inlet and outlet sides of the CRAC heat exchanger, ° C. |
| $\epsilon = \Delta T_{sense}/\Delta T_{inlet}$ | This is the heat exchanger effectiveness. It represents the ratio of the actual heat exchanged between the fluid streams versus the maximum possible heat that could be exchanged. This is a characteristic of the heat exchanger and is determined by its physical design, the thermo-physical properties of the materials that are used in its construction, the thermo-physical properties of the fluids that flow through it, and the mass flow rates of the fluids that flow through the device. |

More particularly, the heat (q) exchanged between the two air streams via the heat exchange device is given by:

$$q = \epsilon \times C_{min} \times \Delta T_{inlet} \quad (1)$$

Where $\epsilon$ is the heat exchanger effectiveness, and $\Delta T_{inlet}$ is the inlet temperature difference that is driving the heat exchange between the two fluid streams (e.g., air) that are flowing across and through the heat exchanger. In the embodiment shown in FIG. 3, $\Delta T_{inlet}$ is equal to $(T_{ci}-T_{si})$. Also, in equation (1) above, the parameter $C_{min}$ is the minimum of the two fluid stream heat capacity rates. Since the flow through the sense loop (~100 CFM) is an order of magnitude lower than that through the CRAC (>8000 CFM), the sense loop air flow heat capacity rate, $C_s$, is the minimum heat capacity rate. This gives:

$$q = \epsilon \times C_s \times (T_{ci} - T_{si}) \quad (2)$$

The heat transferred to the sense loop air stream will increase the air temperature of this sense loop air, and can be calculated using:

$$q = C_s \times (T_{so} - T_{si}) \quad (3)$$

Combining equations (2) and (3) to solve for $\epsilon$, yields, $$\epsilon = \Delta T_{sense} / \Delta T_{inlet}$$

This effectiveness is a function of the CRAC flow rate and can be calibrated in the laboratory to yield the following function, $$Flow_{CRAC} = e^{[(\epsilon+A)/B]}$$

The CRAC flow in SI units which are m³/s is obtained and the CRAC air flow heat capacity rate ($C_r$) in SI units is calculated by multiplying the volumetric flow rate (m³/s) by the air mass density (kg/m³) and the air specific heat (J/kg-K), $$C_r = Flow_{CRAC} \times C_p \times \rho$$

Now that the CRAC air flow heat capacity rate is known, the heat removed from the air stream can be calculated using knowledge of the difference in air temperature between the inlet air ($T_i$) and the exhaust air ($T_o$), $$Load_{CRAC} = C_r \times \Delta T_{HX}$$

Figure 7:
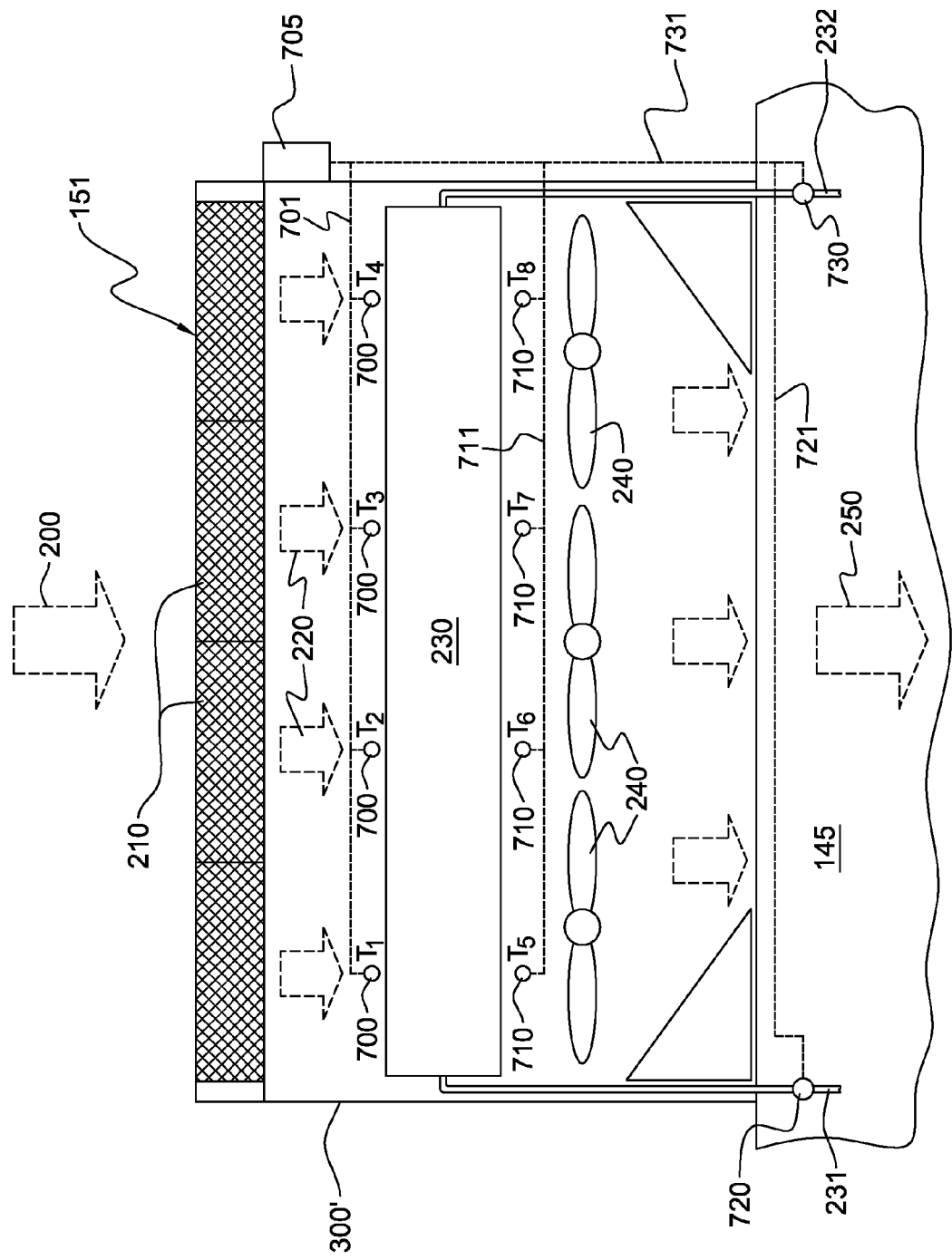
FIG. 7 is a cross-sectional elevational view of one embodiment of a computer room air-conditioning unit, modified with an alternate embodiment of a monitoring system, in accordance with an aspect of the present invention.

FIG. 7 illustrates an alternate embodiment of a CRAC unit with a monitoring system, in accordance with an aspect of the invention disclosed herein. In this embodiment, CRAC unit 300' is configured as a top to bottom airflow unit, wherein warm data center air 200 is drawn through an open vent 151 at an air inlet of the CRAC unit, and flows through filters 210. The conditioned, warm air 220 is then drawn across an air-to-liquid heat exchanger 230 (also referred to herein as the CRAC heat exchanger 230) via one or more air-moving devices 240. Heat is removed from the conditioned, warm air as it passes across the air-to-liquid heat exchanger via coolant passing through the air-to-liquid heat exchanger provided via coolant supply line 231 and coolant return line 232. The resultant conditioned, cooled air 250 is pushed into space 145 below the raised floor data center.

In the illustrated embodiment, the monitoring system associated with the CRAC unit includes multiple temperature sensors $T_1 \ldots T_8$ (700, 710) for facilitating monitoring of the air temperature at the air inlet side and air outlet side of the CRAC heat exchanger 230. Additionally, temperature and pressure sensors 720 and temperature and pressure sensors 730 are provided at the coolant supply line and coolant return line, to respectively measure the coolant inlet temperature and pressure, and coolant outlet temperature and pressure. Contrasting this embodiment with the monitoring system of FIG. 3, it is noted that in the embodiment of FIG. 7, there is no sense loop air-to-air heat exchanger, and no CRAC inlet temperature sensors. Thus, in the embodiment of FIG. 7, the sensed parameters which are used to estimate the CRAC thermal loading and airflow rate, are the temperature sensors at the air inlet and air outlet sides of the CRAC air-to-liquid heat exchanger, as well as the inlet and outlet temperature and pressure sensors in the supply and return lines, respectively. In this embodiment, the sense loop is the coolant flow loop through the CRAC heat exchanger.

Sensed temperature and pressure readings are provided via multiple data lines 701, 711, 721 & 731 to a control unit 705, which in this example is mounted to the CRAC unit. In the embodiment of FIG. 7, the flow rate of the fluid coolant is determined using knowledge of the coolant pressure drop through the air-to-liquid heat exchanger, and the heat removed by the coolant is calculated using the temperature difference between the fluid in the fluid supply and return lines. The heat removed by the coolant is equal to the heat load extracted from the air flowing across the air-to-liquid heat exchanger. The knowledge of the heat load extracted from the air, and the temperature difference across the air-to-liquid heat exchanger is then used to calculate the CRAC airflow rate, as explained further below.

Figure 8:
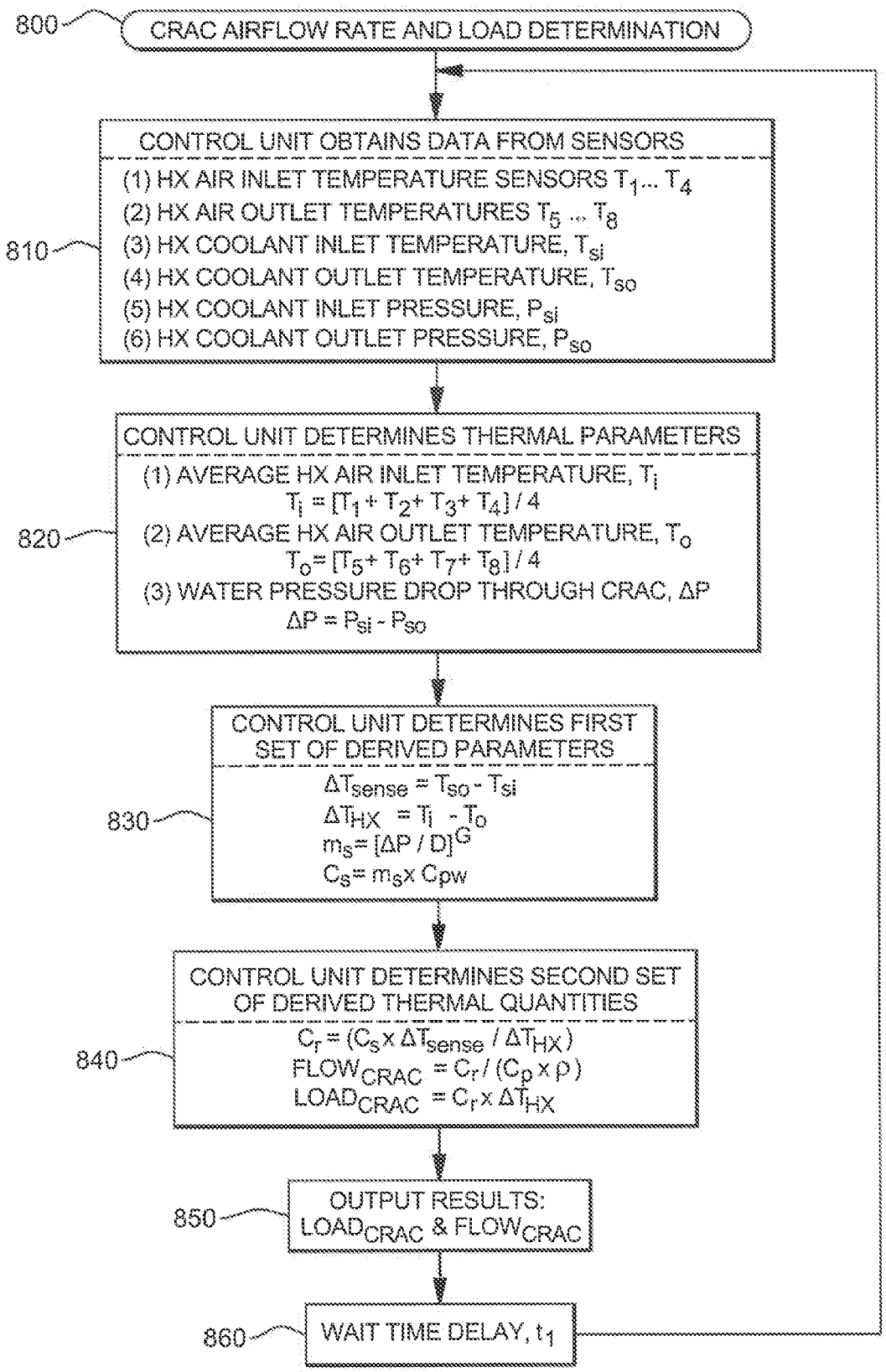
FIG. 8 is a flowchart of one embodiment of processing for determining airflow rate through and heat removal rate of a computer room air-conditioning unit, using the monitoring system of FIG. 7, in accordance with an aspect of the present invention.

FIG. 8 illustrates a flowchart of one embodiment for determining CRAC airflow rate and heat removal rate employing the monitoring system of FIG. 7. CRAC airflow rate and load determination 800 begins with the control unit (or centralized monitoring unit) obtaining data from the various temperature and pressure sensors 810. Specifically, air inlet temperature sensors $T_1 \ldots T_4$ provide air temperature values for air at the air inlet side of the CRAC heat exchanger, outlet temperature sensors $T_5 \ldots T_8$ provide air temperature values for air at the air outlet side of the heat exchanger, coolant inlet temperature sensor $T_{si}$ provides temperature of the liquid coolant at the inlet to the sense loop of the CRAC heat exchanger (i.e., the one or more coolant channels defined within the heat exchanger through which the liquid coolant flows), coolant outlet temperature sensor $T_{so}$ provides a temperature value of the liquid coolant at the coolant outlet of the sense loop, inlet pressure sensor $P_{si}$ provides coolant pressure at the coolant inlet to the sense loop, and pressure sensor $P_{so}$ provides coolant pressure at the outlet of the sense loop.

Next, the control unit calculates various thermal and pressure parameters 820. In this example, the average temperature $T_i$ at the air inlet side of the heat exchanger is calculated by simple averaging of the respective sensed temperature values $T_1 \ldots T_4$. Similarly, the average heat exchanger outlet temperature $T_o$ is calculated by averaging the temperature values from temperature sensors $T_5 \ldots T_8$. The coolant pressure drop ($\Delta P$) through the CRAC heat exchanger is calculated by determining the difference between the coolant pressure at the coolant inlet to the sense loop minus the coolant pressure and the coolant outlet of the sense loop. Note again that in this embodiment, the sense loop refers to the coolant flow loop through the air-to-liquid heat exchanger (alternatively referred to herein as the CRAC heat exchanger).

The control unit next determines various derived parameters 830, including $\Delta T_{sense}$, $\Delta T_{HX}$, $m_s$, and $C_s$. These parameters, which are defined in Table 2 below, are then employed in determining a heat capacity rate for airflow through the CRAC heat exchanger, airflow rate through the CRAC unit, and heat removal rate of the CRAC unit 840. The equations employed in determining heat capacity rate, and airflow rate through the CRAC unit are similar to those described above in connection with the processing of FIG. 6. After determining CRAC airflow rate and heat removal rate, the results are displayed by the control unit or otherwise output, or forwarded to a central monitoring unit of the data center for centralized display or other output 850. As used herein "output" refers to displaying, saving, printing or otherwise providing the determined results to or for use of, for example, a central administrator of the facility being cooled by the air-conditioning unit. Processing then waits a defined time interval $t_1$ before automatically returning to obtain a new set of temperature and pressure sensor readings 860, and repeating the determination of CRAC airflow rate and/or heat removal rate.

The variables and equations employed in the flowchart in FIG. 8 are defined in Table 2 below.

TABLE 2

| Variable/Equation | Definition |
| --- | --- |
| $T_1, T_2, T_3, T_4,$ | Air temperatures measured via sensors located at the air inlet side of the CRAC heat exchanger, °C. |
| $T_5, T_6, T_7, T_8$ | Air temperatures measured via sensors located at the air outlet side of the CRAC heat exchanger, °C. |
| $T_{si}$ | Fluid temperature measured via sensor located at the inlet of the sense loop through the CRAC heat exchanger, °C. |
| $T_{so}$ | Fluid temperature measured via sensor located at the coolant outlet of the sense loop through the CRAC heat exchanger, °C. |
| $T_i$ | Average air temperature calculated via averaging data from temperature sensors at the air inlet side of the CRAC heat exchanger, °C. |
| $T_o$ | Average air temperature calculated via averaging of data from temperature sensors at the air outlet side, °C. |
| $\Delta T_{inlet}$ | Temperature difference between the average HX air inlet ($T_i$) & the fluid inlet to the sense loop ($T_{si}$), °C. |
| $\Delta T_{sense}$ | Fluid temperature difference between the inlet and outlet of the sense loop ($T_{so} - T_{si}$), °C. |
| $\Delta T_{HX}$ | Temperature difference between air at air inlet side ($T_i$) & air at air outlet side ($T_o$) of the CRAC heat exchanger, °C. |
| $\epsilon$ | Effectiveness of the heat exchanger. |
| $Flow_{CRAC}$ | CRAC airflow rate in SI units, m³/s. |
| $C_r$ | Heat capacity rate of the CRAC airflow which characterizes the air's ability to carry heat away. It is the product of the volumetric flow rate, the mass density, and the mass specific heat, W/°C. |
| $Load_{CRAC}$ | Heat removal rate of the CRAC unit (i.e., cooling function that it is performing) W. |
| $\rho$ | Mass density of air in kg/m³. |
| $C_p$ | Air specific heat (J/kg-K). |
| $P_{si}$ | Fluid pressure recorded via sensor located at the inlet side of the sense loop, Pascals. |
| $P_{so}$ | Fluid pressure recorded via sensor located at the outlet side of the sense loop, Pascals. |
| $\Delta P$ | Fluid pressure drop across the CRAC heat exchanger between inlet/outlet sense points, Pascals. |
| $m_s$ | Fluid mass flow rate through the CRAC heat exchanger, kg/s. |
| $C_s$ | Fluid heat capacity rate through the CRAC heat exchanger, W/°C. |
| $C_{pw}$ | Fluid specific heat, available via commonly available technical sources for various liquid coolants (e.g., water), J/kg-K. |
| $\rho_w$ | Fluid mass density available via commonly available technical sources for various liquid coolants, Kg/m³. |
| $\Delta P = P_{so} - P_{si}$ | Fluid pressure difference between the sense loop fluid at the inlet and the outlet. |
| $m_s = [\Delta P/D]^G$ | This is the mass flow rate of the water flowing through the sense loop which is also the CRAC heat exchanger in this embodiment. The constants D and G can be determined via lab test or calibration and can then be used in conjunction with the $\Delta P$ to determine the mass flow rate. |
| $C_s = m_s \times C_{pw}$ | This is the heat capacity rate of the fluid flowing through the CRAC heat exchanger. |
| $C_s \times \Delta T_{sense}$ | This is the heat gained by the fluid stream in the CRAC (sense) heat exchanger. |
| $C_r = C_s \times \Delta T_{sense}/\Delta T_{HX}$ | This is the air heat capacity rate that is flowing across the CRAC. Since the heat lost by the air is gained by the fluid, this is derived from a simple energy balance where the heat gained and lost are equated. |
| $Flow_{CRAC} = C_r/(C_p \times \rho)$ | When heat capacity rate $C_r$ is divided by the product of the air specific heat and the air density, it yields the air volumetric air flow rate in SI units, m³/s. |

Those skilled in the art will note from the above description that provided herein are automated techniques for determining the CRAC heat removal rate, as well as the volumetric airflow rate through a CRAC unit. This information may advantageously be employed in monitoring operation of the CRAC unit to determine, for example, that the CRAC unit is operating within specification, and if not, for signaling a failure to be addressed. The CRAC heat load is significant in identifying which CRAC units might be under-utilized, and which are being over-utilized in a data center containing multiple CRAC units. Further, during installation, CRAC volumetric airflow rates may be monitored to ensure that the data center has sufficient chilled airflow capability for a particular IT installation. Knowledge of the CRAC heat removal rate and the CRAC volumetric airflow rates generally allows for monitoring of the CRAC units and adjusting of airflow rates within the data center.

The detailed description presented above is discussed in terms of procedures which can be executed on a computer, a network or a cluster of computers. These procedural descriptions and representations are used by those skilled in the art to most effectively convey the substance of their work to others skilled in the art. They may be implemented in hardware or software, or a combination of the two.

A procedure is here, and generally, conceived to be a sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers, objects, attributes or the like. It should be noted, however, that all of these and similar terms are to be associated with the appropriate physical quantities and are merely convenient labels applied to these quantities.

Further, the manipulations performed are often referred to in terms, such as closing or opening, which are commonly associated with manual operations performed by a human operator. No such intervention of a human operator is necessary in the operations described herein which form part of the present invention; the operations may be implemented as automatic machine operations. Useful machines for performing the operations of the present invention include general purpose digital computers or similar devices.

Aspects of the invention are preferably implemented in a high level procedural or object-oriented programming language to communicate with a computer. However, the inventive aspects can be implemented in assembly or machine language, if desired. In any case, the language may be a compiled or interpreted language.

The invention may be implemented as a mechanism or a computer program product comprising a recording medium. Such a mechanism or computer program product may include, but is not limited to CD-ROMs, diskettes, tapes, hard drives, computer RAM or ROM and/or the electronic, magnetic, optical, biological or other similar embodiment of the program. Indeed, the mechanism or computer program product may include any solid or fluid transmission medium, magnetic or optical, or the like, for storing or transmitting signals readable by a machine for controlling the operation of a general or special purpose programmable computer according to the method of the invention and/or to structure its components in accordance with a system of the invention.

Aspects of the invention may be implemented in a system. A system may comprise a computer that includes a processor and a memory device and optionally, a storage device, an output device such as a video display and/or an input device such as a keyboard or computer mouse. Moreover, a system may comprise an interconnected network of computers. Computers may equally be in stand-alone form (such as the traditional desktop personal computer) or integrated into another environment (such as a partially clustered computing environment). The system may be specially constructed for the required purposes to perform, for example, the method steps of the invention or it may comprise one or more general purpose computers as selectively activated or reconfigured by a computer program in accordance with the teachings herein stored in the computer(s). The procedures presented herein are not inherently related to a particular computing environment. The required structure for a variety of these systems will appear from the description given.

The capabilities of one or more aspects of the present invention can be implemented in software, firmware, hardware or some combination thereof.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of monitoring an air-conditioning unit, the method comprising:
   sensing inlet temperature and outlet temperature of a fluid passing through an air-to-air heat exchanger associated with the air-conditioning unit;
   sensing air temperature at an air inlet side of the air-to-air heat exchanger, wherein air flows across the air-to-air heat exchanger from the air inlet side to an air outlet side thereof;
   automatically determining, by a processor, at least one of airflow rate through or heat removal rate of the air-conditioning unit employing at least in part effectiveness of the air-to-air heat exchanger, the automatically determining comprising automatically determining effectiveness of the air-to-air heat exchanger employing at least the sensed inlet temperature and outlet temperature of fluid passing through the air-to-air heat exchanger, and the sensed air temperature at the air inlet side of the air-to-air heat exchanger; and
   outputting the determined airflow rate through or heat removal rate of the air-conditioning unit.

2. The method of claim 1, wherein the air-to-air heat exchanger is disposed at an air inlet of the air-conditioning unit, and wherein a known percentage of air ingressing into the air-conditioning unit passes across the air-to-air heat exchanger, and sensing inlet temperature and sensing outlet temperature of the fluid passing through the heat exchanger comprises sensing inlet temperature and outlet temperature of air passing through the air-to-air heat exchanger.

3. The method of claim 2, wherein the automatically determining comprises automatically determining airflow rate through the air-conditioning unit employing in part a difference between the sensed inlet temperature and outlet temperature of air passing through the air-to-air heat exchanger ($\Delta T_{sense}$).

4. The method of claim 3, wherein the air-conditioning unit further comprises an air-to-liquid heat exchanger, wherein air flows across the air-to-liquid heat exchanger from an air inlet side to an air outlet side thereof after flowing across the air-to-air heat exchanger, and wherein the method further comprises determining air temperature at the air inlet side of the air-to-liquid heat exchanger, and wherein determining effectiveness of the air-to-air heat exchanger comprises employing the difference between the sensed inlet temperature and outlet temperature of air passing through the air-to-air heat exchanger ($\Delta T_{sense}$), and a difference between the sensed air temperature at the air inlet side of the air-to-air heat exchanger and the sensed air temperature at the air inlet side of the air-to-liquid heat exchanger ($\Delta T_{inlet}$).

5. The method of claim 4, further comprising pre-calibrating the air-to-air heat exchanger to correlate $\Delta T_{sense}$ and $\Delta T_{inlet}$ to effectiveness of the air-to-air heat exchanger for one or more airflow rates through the air-to-air heat exchanger, and wherein the method further comprises obtaining the airflow rate through the air-to-air heat exchanger and employing the airflow rate through the air-to-air heat exchanger and effectiveness of the air-to-air heat exchanger in determining airflow rate across the air-to-air heat exchanger and hence the airflow rate through the air-conditioning unit.

6. The method of claim 4, wherein the method further comprises periodically, automatically performing the sensing inlet temperature and outlet temperature, the sensing air temperature, the automatically determining, and the outputting.

7. The method of claim 4, wherein the air-conditioning unit is a computer room air-conditioning unit, and effectiveness ($\varepsilon$) of the air-to-air heat exchanger is defined as:

$$\varepsilon = \frac{\Delta T_{sense}}{\Delta T_{inlet}}$$

and wherein the automatically determining comprises determining airflow rate through the computer room air-conditioning unit as:

$$\text{Flow}_{CRAC} = e^{[(\varepsilon + A)/B]}$$

where A and B are constants obtained by pre-calibrating the air-to-air heat exchanger for a determined airflow rate through the air-to-air heat exchanger.

8. The method of claim 7, further comprising sensing air temperature at the air outlet side of the air-to-liquid heat exchanger, and wherein the determining comprises determining heat removal rate of the computer room air-conditioning unit by determining heat capacity rate ($C_r$) of the computer room air-conditioning unit as a product of airflow rate through the computer room air-conditioning unit, mass density of the airflow through the computer room air-conditioning unit, and mass specific heat of the airflow through the computer room air-conditioning unit, and using the heat capacity rate ($C_r$) of the airflow to determine heat removal rate of the computer room air-conditioning unit by multiplying the heat capacity rate ($C_r$) of the computer room air-conditioning unit by a difference between air temperatures at the air inlet and air outlet sides of the air-to-liquid heat exchanger ($\Delta T_{HX}$).

9. The method of claim 8, further comprising sensing air inlet temperature at a plurality of locations at the air inlet side of the air-to-air heat exchanger and averaging the sensed temperatures at the plurality of locations at the air inlet side to obtain the air temperature at the air inlet to the computer room air-conditioning unit, and sensing air temperature at a plurality of locations at the air inlet side of the air-to-liquid heat exchanger and averaging the sensed temperatures at the plurality of locations at the air inlet side to obtain the air temperature at the air inlet side of the air-to-liquid heat exchanger, and sensing air temperature at a plurality of locations at the air outlet side of the air-to-liquid heat exchanger and averaging the sensed temperatures at the plurality of locations at the air outlet side of the air-to-liquid heat exchanger to obtain the sensed air temperature at the air outlet side of the air-to-liquid heat exchanger.

10. A method of monitoring an air-conditioning unit, the method comprising:

sensing inlet temperature and outlet temperature of a fluid passing through a heat exchanger associated with the air-conditioning unit;

sensing air temperature at an air inlet side of the heat exchanger, wherein air flows across the heat exchanger from the air inlet side to an air outlet side thereof;

automatically determining, by a processor, at least one of airflow rate through or heat removal rate of the air-conditioning unit, the automatically determining employing the sensed inlet temperature and outlet temperature of fluid passing through the heat exchanger, and the sensed air temperature at, the air inlet side of the heat exchanger;

outputting the determined airflow rate through or heat removal rate of the air-conditioning unit; and wherein the heat exchanger comprises an air-to-liquid heat exchanger, and the fluid comprises a coolant, and wherein the method further comprises:

sensing coolant pressure at a coolant inlet to the air-to-liquid heat exchanger and coolant pressure at a coolant outlet of the air-to-liquid heat exchanger;

sensing air temperature at the air outlet side of the air-to-liquid heat exchanger;

determining heat capacity rate ($C_r$) of air flowing across the air-to-liquid heat exchanger employing coolant mass flow rate through the air-to-liquid heat exchanger, and a difference between the sensed coolant temperatures at the coolant outlet and coolant inlet of the air-to-liquid heat exchanger ($\Delta T_{sense}$), and a difference between the sensed air temperatures at the air inlet and air outlet sides of the air-to-liquid heat exchanger ($\Delta T_{HX}$); and employing heat capacity rate of air flowing across the heat exchanger in determining at least one of airflow rate through or heat removal rate of the air-conditioning unit.

11. The method of claim 10, further comprising determining the coolant mass flow rate through the air-to-liquid heat exchanger employing a difference ($\Delta P$) between the sensed coolant pressure at the coolant inlet to the air-to-liquid heat exchanger ($P_{si}$) and the sensed coolant pressure at the coolant outlet of the air-to-liquid heat exchanger ($P_{so}$), and by precalibrating the air-to-liquid heat exchanger, wherein the mass flow rate ($m_s$) of coolant through the heat exchanger is defined as:

$$m_s = [\Delta P/D]^G$$

wherein D and G are constants obtained by pre-calibrating the heat exchanger for a determined coolant flow rate through the heat exchanger.

12. The method of claim 10, wherein sensing air temperature at the air inlet side of the heat exchanger comprises sensing air temperature at a plurality of locations at the air inlet side of the heat exchanger and averaging the sensed air inlet temperatures to obtain the air temperature at the air inlet side of the heat exchanger, and wherein sensing air temperature at the air outlet side of the heat exchanger comprises sensing air temperature at a plurality of locations at the air outlet side of the heat exchanger and averaging the sensed air outlet temperatures to obtain the sensed air temperature at the air outlet side of the heat exchanger, and wherein the method further comprises waiting a defined interval before automatically repeating the determining of at least one of airflow rate through or heat removal rate of the air-conditioning unit.

13. The method of claim 10, wherein heat capacity rate ($C_r$) of air flowing across the air-to-liquid heat exchanger is determined as:

$$C_r = (C_s \times \Delta T_{sense}/\Delta T_{HX})$$

where $C_s$ is the coolant heat capacity rate through the air-to-liquid heat exchanger, and wherein the coolant heat capacity rate is determined as:

$$C_s = m_s \times C_{pw}$$

where:
  $m_s$=coolant mass flow rate through the air-to-liquid heat exchanger;
  $C_{pw}$=coolant specific heat for a given coolant temperature.

14. The method of claim 13, wherein the air-conditioning unit is a computer room air-conditioning unit, and the determining comprises determining airflow rate through the computer room air-conditioning unit and heat removal rate of the computer room air-conditioning unit, the determining airflow rate through the computer room air-conditioning unit employing:

$$\text{Flow}_{CRAC} = C_r/(C_p \times \rho);$$

where:
  $C_p$ is the air specific heat and $\rho$ is the air mass density, and wherein determining heat removal rate of the computer room air-conditioning unit employs:

$$\text{Load}_{CRAC} = C_r \times \Delta T_{HX}.$$

15. A monitoring system for an air-conditioning unit, the monitoring system comprising:
  an air-to-air heat exchanger associated with the air-conditioning unit, wherein air flows across the air-to-air heat exchanger and fluid passes through the air-to-air heat exchanger;
  a fluid temperature sensor disposed at a fluid inlet to the heat exchanger and a fluid temperature sensor disposed at a fluid outlet of the air-to-air heat exchanger;
  at least one air temperature sensor disposed at an air inlet side of the air-to-air heat exchanger, wherein air flows across the air-to-air heat exchanger from the air inlet side to an air outlet side thereof; and
  a control unit coupled to the temperature sensors for obtaining sensed temperature values and for employing the sensed temperature values in dynamically determining and outputting at least one of airflow rate through or heat removal rate of the air-conditioning unit employing, at least in part, effectiveness of the air-to-air heat exchanger, the dynamically determining including automatically determining effectiveness of the air-to-air heat exchanger.

16. The monitoring system of claim 15, wherein the air-to-air heat exchanger is disposed at an air inlet of the air-conditioning unit, and wherein a known percentage of air ingressing into the air-conditioning unit passes across the air-to-air heat exchanger, and wherein the air-conditioning unit further comprises an air-to-liquid heat exchanger, air flows across the air-to-liquid heat exchanger from an air inlet side to an air outlet side thereof after flowing across the air-to-air heat exchanger, and wherein the monitoring system further comprises at least one air temperature sensor disposed at an air inlet side of the air-to-liquid heat exchanger, and the control unit determines air temperature at the air inlet side of the of air-to-liquid heat exchanger employing the at least one air temperature sensor disposed at the air inlet side of the air-to-liquid heat exchanger, and the control unit dynamically determines effectiveness of the air-to-air heat exchanger employing a difference between the sensed inlet temperature and outlet temperature of air passing through the air-to-air heat exchanger ($\Delta T_{sense}$), and a difference between the sensed air temperature at the air inlet side of the air-to-air heat exchanger and the sensed air temperature at the air inlet side of the air-to-liquid heat exchanger ($\Delta T_{inlet}$), and wherein the determining comprises determining airflow rate through the air-conditioning unit employing the determined effectiveness of the air-to-air heat exchanger.

17. The monitoring system of claim 16, wherein the air-conditioning unit is a computer room air-conditioning unit, and effectiveness ($\epsilon$) of the air-to-air heat exchanger is defined as:

$$\varepsilon = \frac{\Delta T_{sense}}{\Delta T_{inlet}}$$

and wherein the control unit determines airflow rate through the computer room air-conditioning unit as:

$$\text{Flow}_{CRAC} = e^{[(\epsilon + A)/B]}$$

where A and B are constants obtained by pre-calibrating the air-to-air heat exchanger for a determined airflow rate through the air-to-air heat exchanger.

18. The monitoring system of claim 17, further comprising at least one air temperature sensor disposed at an air outlet side of the air-to-liquid heat exchanger, and wherein the control unit determines heat removal rate of the computer room air-conditioning unit by determining heat capacity rate ($C_r$) of the computer room air-conditioning unit as a product of airflow rate through the computer room air-conditioning unit, mass density of airflow through the computer room air-conditioning unit, and mass specific heat of the airflow through the computer room air-conditioning unit, and using the heat capacity rate ($C_r$) of the airflow to determine heat removal rate of the computer room air-conditioning unit by multiplying the heat capacity rate ($C_r$) of the computer room air-conditioning unit by a difference between the temperatures at the air inlet and air outlet sides of the air-to-liquid heat exchanger ($\Delta T_{HX}$).

19. A monitoring system for an air-conditioning: unit, the monitoring system comprising:

a heat exchanger associated with the air-conditioning unit, wherein air flows across the heat exchanger and fluid passes through the heat exchanger;

a fluid temperature sensor disposed at a fluid inlet to the heat exchanger and a fluid temperature sensor disposed at a fluid outlet of the heat exchanger;

at least one air temperature sensor disposed at an air inlet side of the heat exchanger, wherein air flows across the heat exchanger from the air inlet side to an air outlet side thereof; and a control unit coupled to the temperature sensors for obtaining sensed temperature values and for employing the sensed temperature values in dynamically determining and outputting at least one of airflow rate through or heat removal rate of the air-conditioning unit; and wherein the heat exchanger comprises an air-to-liquid heat exchanger, and the fluid comprises a coolant, and wherein the monitoring system further comprises:

a coolant pressure sensor at a coolant inlet to the air-to-liquid heat exchanger and a coolant pressure sensor at a coolant outlet of the air-to-liquid heat exchanger;

at least one air temperature sensor at the air outlet side of the air-to-liquid heat exchanger; and wherein the control unit is coupled to the coolant pressure sensors and the at least one air temperature sensor at the air outlet side of the air-to-liquid heat exchanger for obtaining sensed coolant pressure values and a sensed temperature value, respectively, and determining heat capacity rate ($C_r$) of air flowing across the air-to-liquid heat exchanger employing coolant mass flow rate through the air-to-liquid heat exchanger, and a difference between the sensed coolant temperatures at the coolant outlet and coolant inlet of the air-to-liquid heat exchanger ($\Delta T_{sense}$), and a difference between the sensed air temperatures at the air inlet and air outlet sides of the air-to-liquid heat exchanger ($\Delta T_{HX}$), and employing heat capacity rate ($C_r$) of air flowing across the heat exchanger in determining at least one of airflow rate through or heat removal rate of the air-conditioning unit.

20. The monitoring system of claim 19, wherein the air-conditioning unit is a computer room air-conditioning unit, and wherein heat capacity rate ($C_r$) of air flowing across the air-to-liquid heat exchanger is determined as:

$$C_r = (C_s \times \Delta T_{sense}/\Delta T_{HX})$$

where $C_s$ is the coolant heat capacity rate through the air-to-liquid heat exchanger, and wherein the coolant heat capacity rate is determined as:

$$C_s = m_s \times C_{pw}$$

where:

$m_s$ = coolant mass flow rate through the air-to-liquid heat exchanger;

$C_{pw}$ = coolant specific heat for a given coolant temperature; and wherein the control unit determines airflow rate through the computer room air-conditioning unit and heat removal rate of the computer room air-conditioning unit, and the determining airflow rate through the computer room air-conditioning unit employs:

$$\text{Flow}_{CRAC} = C_r/(C_p \times \rho);$$

where:

$C_p$ is the air specific heat and $\rho$ is the air mass density, and wherein determining heat removal rate of the computer room air-conditioning unit employs:

$$\text{Load}_{CRAC} = C_r \times \Delta T_{HX}.$$

* * * * *